March 21, 1967 E. M. GRIEST ETAL 3,310,432

METHOD FOR APPLYING ELECTRICAL CONDUCTORS ON A SMOOTH VITREOUS SURFACE AND ARTICLE

Filed July 11, 1963

INVENTORS
Edward M. Griest, Paul R. Theobald
BY Clarence R. Patty, Jr.
ATTORNEY

United States Patent Office 3,310,432
Patented Mar. 21, 1967

3,310,432
METHOD FOR APPLYING ELECTRICAL CONDUCTORS ON A SMOOTH VITREOUS SURFACE AND ARTICLE

Edward M. Griest, Painted Post, N.Y., and Paul R. Theobald, Raleigh, N.C., assignors to Corning Glass Works, Corning, N.Y., a corporation of New York Filed July 11, 1963, Ser. No. 294,353
18 Claims. (Cl. 117—212)

The present invention relates to electrical circuits and more particularly to a method for producing an electrically conductive pattern of predetermined configuration on a dielectric substrate, but is in no way limited to such application.

Resistors, heaters, conductors, printed circuits, and the like are formed of patterned resistive or electroconductive coatings applied to dielectric substrates formed of such materials as glass, ceramics, plastics, and the like. Solderable conductor terminals are thereafter applied to the dielectric substrate in electrical contact with said resistive or electroconductive coatings.

One of the major problems encountered in producing electroconductive film resistor circuits on glass or other smooth dielectric substrates has been the lack of an inexpensive, precision-pattern metallizing or copper plating process, which could be used to produce intricate resistor-conductor circuits by providing solderable conductor terminals strongly bonded to said smooth dielectric substrate. One prior art method of applying copper terminals to an electroconductive film resistor requires the dielectric substrate surface to be roughened so that it would have microscopic holes and crevices within which suitable catalyst atoms may thereafter be precipitated. Subsequently deposited copper atoms build up on said catalyst atoms to form a continuous film which is mechanically bonded to the substrate by means of many small holding anchors formed by the deposition of said copper within said holes and crevices in the substrate surface. When the dielectric substrate surface is smooth, as in the case where it is formed of glass or ceramic having glazed surfaces, such holding anchors are not formed by the deposited copper resulting in very poor adhesion of the film to the smooth substrate surface. Other possible methods of applying solderable conductor terminals to such an electroconductive film resistor are firing-on of metallic paints, vacuum deposition, vapor plating, flame spraying, and chemical deposition. Such methods are undesirable or impractical due to their high costs and because they are not suitable for intricate patterning. Further, such methods cause degradation of the electroconductive film due to the high firing temperatures required, are hazardous due to the chemical process involved, require difficult and expensive masking of the areas surrounding the terminals, and most important result in poor adhesion between the terminals and the smooth substrate surface.

It is an object of this invention to provide an inexpensive method for applying an intricately patterned electrically conductive coating on a smooth dielectric substrate.

It is another object of this invention to provide a method for applying to a smooth dielectric substrate surface a readily solderable electrically conductive coating having good adhesion to said surface.

A further object is to provide a method for forming a strongly adhering solderable terminal for film resistors formed on glass or glazed ceramic substrates.

Still another object is to provide an economical method for applying a copper coating to the surface of a smooth dielectric substrate.

A still further object is to provide an economical method of forming an electrical circuit on a smooth vitreous substrate.

According to the present invention, an electrical circuit having electrically conductive and resistive portions in contact with each other upon a dielectric substrate may be formed by applying to the surface of said substrate an adherent resistive film of metallic oxide having a configuration corresponding to the combined resistive and conductive portions of said circuit, coating a resist on said film corresponding to the resistive portion of said circuit, the exposed portion of said film corresponding to said conductive portion, reducing an exterior layer of said exposed portion of film to form a metallic layer thereon, and thereafter immersing the substrate with the exposed metallic layer thereon in an electroless copper plating bath whereby copper is deposited on the metallic layer.

Additional objects, features, and advantages of the present invention will become apparent, to those skilled in the art, from the following detailed description and the attached drawing, on which, by way of example, only the preferred embodiments of this invention are illustrated.

Any metallic oxide electroconductive coating material, which can be applied as a thin film or coating is suitable for the present purpose. Such films or coatings are generally composed of metallic oxide compositions having various fillers, blinders and the like. For one example of a suitable film, its characteristics and method of application, reference is made to U.S. Patent No. 2,564,706 issued to John M. Mochel. For another example of a suitable film, reference is made to U.S. Patent No. 2,564,707 issued to John M. Mochel.

FIGURES 2–6 illustrate the various steps of the method and the resulting product of this invention. In accordance with this invention, a dielectric substrate 10, having smooth exterior surfaces, is cleaned by any suitable commercial cleaning method, such as dipping in an ultrasonically agitated bath of acetone, xylene, trichlorethylene or the like. Suitable substrate materials are glass, ceramics, plastics, and the like. A suitably patterned coating 12 of an electroconductive metallic oxide material, having a predetermined configuration corresponding to the combined resistive and conductive portions of a desired circuit, is then applied to said substrate. A coating 14, of a suitable acid resist, having a configuration corresponding to the desired resistive portion of said circuit, is applied to a portion of said electroconductive coating 12. It should be noted that said resist may also be applied as a continuous layer with the excess thereafter removed by any one of several processes well known in the art. The substrate, the metallic oxide coating, the method of cleaning the substrate, the method of applying the metallic oxide coating, the resist, and the method of applying the resist are not critical elements of this invenion.

Figure 1:
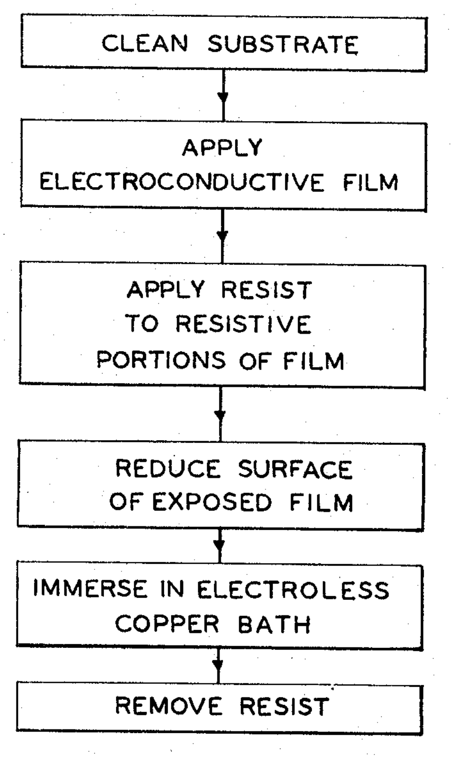
FIGURE 1 is a flow diagram illustrating the steps of the method of this invention.
Figure 2:
FIGURES 2–6 are diagrammatic views illustrating the various steps of one embodmient of this invention.
Figure 3:
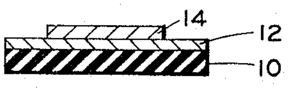
Figure 4:
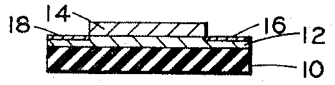
Figure 5:
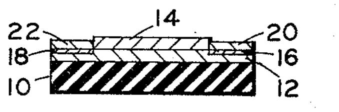
Figure 6:
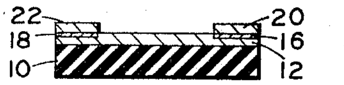
Figure 7:
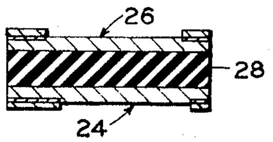
FIGURE 7 is a cross section of a thin wafer circuit device having a patterned circuit formed on each flat surface of the substrate thereof in accordance with this invention.

The meallic oxide film 12, surrounding resist coating 14, is then caused to be chemically reduced at the exterior surface of said film 12 to form metallic layers 16 and 18. The article so formed is then immersed in an electroless copper plating bath whereby copper is deposited onto the metallic surfaces of layers 16 and 18 to form copper coatings 20 and 22 respectively. Thereafter, resist coating 14 is suitably removed. FIGURE 7 illustrates another embodiment of this invention where two patterned circuits 24 and 26 are formed on a dielectric substrate 28, one on each flat surface thereof, by duplicating the method hereinabove described either concurrently or successively.

Figure 8:
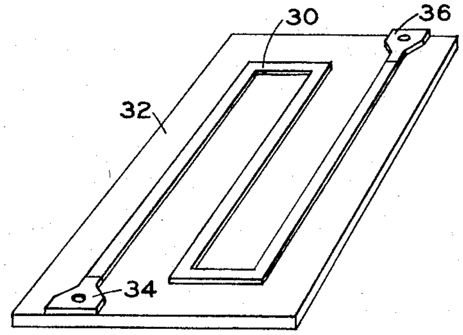
FIGURE 8 is an oblique view of a thin wafer circuit device having a resistance element formed on one flat surface of the substrate thereof in accordance with this invention.

FIGURE 8 illustrates still another embodiment of this invention where a patterned electroconductive coating 30 is applied to the smooth surface of a dielectric substrate 32 to form an electric circuit, which circuit is terminated by strongly adhering, readily solderable conductor terminals 34 and 36 applied in accordance with the method hereinabove described.

It can be readily seen that any number of patterns of any configuration and arrangement may be formed on one or both flat surfaces of a substrate in accordance with this invention.

While any suitable acid resist material, which may be applied as a film or coating and is compatible with and adherable to said metallic oxide film, such as paraffin or the like, may be utilized, it is preferred to use a photosensitive resist, such as that sold under the trade name of Kodak KPR Photoresist by Eastman Kodak Company of Rochester, N.Y. This preferred resist, catalog No. KPR, and the method for using it is described in publication P–7, entitled "Kodak Photosensitive Resists for Industry," copyrighted in 1962 by the Eastman Kodak Company of Rochester, New York.

A typical example of carrying out this invention is illustrated by the following. A three-eights by one inch substrate of hot pressed alumina having a thickness of about 0.050 inch and a smooth glazed exterior surface may be suitably cleaned by dipping in an ultrasonically agitated acetone bath. Thereafter, an electroconductive coating having a configuration corresponding to the shape of the desired resistive and conductive or terminal portions of an electrical circuit is applied to one of its flat surfaces. This coating may be of the type described in the heretofore noted Mochel Patent No. 2,564,706.

A continuous layer of photosensitive resist material comprising the heretofore noted preferred Kodak photosensitive resist is sprayed over the electroconductive coating and is thereafter dried at a temperature of not over 250° F. A photographic negative having a pattern corresponding to the desired resistive portion of said circuit thereon, may be placed over the resist layer and the assembly exposed to a carbon arc light for approximately 2 minutes. Immediately after exposure, the negative is removed and the photosensitive resist material is developed by immersion in a photo resist developer for 2 to 3 minutes. The photographically unexposed photosensitive resist material may thereafter be washed out by means of a xylene spray. After this washout, only that portion of the electroconductive coating which forms the desired resistance pattern is covered with photographically exposed resist material, while the balance is uncovered.

A mixture is prepared comprising by weight approximately one part powdered zinc suspended in approximately 100 parts of one percent by weight hydrochloric acid. The alumina wafer with the patterned electroconductive coating and resist material thereon may be immersed in the zinc-hydrochloric acid mixture for a period of approximately 5 to 30 seconds, depending upon the thickness and the electrical conductivity of the electroconductive film and the desired thickness of the reduced metallic layer. The upper surface of the exposed tin-oxide electroconductive film surrounding the resist material is reduced in the zinc-hydrochloric acid mixture causing a layer of metallic tin to form on the surface of said exposed tin oxide film. The thickness of this metallic tin film is determined by the concentration of the zinc-hydrochloric acid mixture and the duration of the immersion of the wafer therein. The alumina wafer is thereafter rinsed in distilled water.

An electroless copper plating bath solution is prepared comprising 13.3 ounces potassium sodium tartrate, 4.0 ounces copper sulfate, 5.3 ounces sodium hydroxide, 4.3 ounces of sodium carbonate, and 4.0 ounces of 37 percent by weight formaldehyde per a gallon of distilled water. The alumina wafer with the reduced metallic tin layer exposed is immersed in the electroless copper plating bath where the metallic tin atoms serve to catalyze the nucleation of copper atoms probably as follows:

$$Cu^{++} + HCHO + OH^- \xrightarrow[Sn^0]{} Cu^0 + HCOO^- + 2H^+$$

It is found that there is excellent adhesion between the plated copper layer and the reduced tin layer. Since there are no microscopic holding anchors on such a smooth alumina substrate to result in mechanical bonding as heretofore described, it is believed that the bonding mechanism is now a function of crystalline lattice matching between the unreacted tin oxide, the metallic tin atoms formed by the chemical reduction, and the deposited copper atoms. Accordingly, there are no abrupt interfaces separating the tin oxide-tin-copper phases, but rather a close interlocking of all three into the well-bonded system.

After a suitable thickness of copper is deposited on the tin layer, the wafer may be removed from the electroless copper plating bath and the remaining resist material thereafter removed by any suitable means, such as, for example, by using a commercial stripper or by washing in a bath of trichloroethylene or the like.

Another example of carrying out this invention is illustrated by the following. A glass substrate may be cleaned and an electroconductive coating applied as described in the preceding example. Thereafter, a layer of acid resist material consisting essentially of paraffin may be applied substantially coextensively over that portion of said electroconductive coating corresponding to the desired resistive portion of the ultimate circuit. The exposed part of said electroconductive film corresponding to the desired conductive portion of said circuit may thereafter be chemically reduced and have a copper layer applied to it as described in the preceding example. The paraffin resist may thereafter be removed by any suitable method known in the art such as by wiping.

The metallic coatings described in the above examples provided bond strengths of about 2000 pounds per square inch as a result of a perpendicular pull on wires soldered thereto.

The zinc-hydrochloric acid mixture has been described as being in a ratio of 1 to 100. It is readily seen that the ratio of this mixture may be changed to increase or decrease the oxide reduction time. One familiar with the art can readily select the proper reducing mixture and ratio depending on the particular application. Furthermore, acids such as 10 percent by weight fluoroboric acid or the like can be substituted for the hydrochloric acid, and metals other than zinc may be used if they have a tendency greater than that of tin to be oxidized in an aqueous solution such as iron, aluminum, nickel, cobalt, cadmium, chromium, manganese or the like. In addition, many combinations of the plating bath constituents can also be used. Solutions, such as those found in the "Metal Finishing Guidebook" published by Finishing Publications, Inc. of Westwood, N.J., may be used. One familiar with the art can readily select the suitable electroless plating solution for the purposes of this invention.

The reduction of the metallic oxide film has been described as chemical reduction, however, it is readily seen, by one familiar with the art, that electrochemical reduction may also be used.

Although the present invention has been described with respect to specific details of certain embodiments thereof, it is not intended that such details be limitations upon the scope of the invention except insofar as set forth in the following claims.

What is claimed is:

1. The method of applying a metallic coating to the surface of a dielectric substrate comprising (a) forming an adherent film of metallic oxide on the surface of said substrate, (b) reducing an exterior portion of said film to form a metallic layer on the remaining portion of said film, and thereafter (c) depositing an adherent metallic coating on said metallic layer.

2. The method of claim 1 wherein said metallic oxide comprises tin oxide.

3. The method of claim 2 wherein said exterior portion of said film is chemically reduced by immersion into a mixture of zinc and hydrochloric acid.

4. The method of claim 3 wherein said metallic coating is copper and is deposited by immersion in an electroless copper plating bath.

5. The method of claim 1 wherein said dielectric substrate is selected from the group consisting of glass, ceramic, glazed ceramic and plastic.

6. A method of forming an electrical conductor on a dielectric substrate comprising the steps of (a) applying an adherent film of metallic oxide to the surface of said substrate, (b) masking a first area of said film with a resist leaving a second area of said film exposed, (c) reducing an exterior portion of the exposed film to form a metallic layer thereon, and thereafter (d) immersing the substrate thus coated in an electroless copper plating bath whereby copper is deposited onto the metallic layer surface.

7. The method of claim 6 wherein said metallic oxide comprises tin oxide.

8. The method of claim 7 wherein said tin oxide is chemically reduced by immersion into a mixture of zinc and hydrochloric acid.

9. The method of claim 6 wherein said dielectric substrate is selected from the group consisting of glass, ceramic, glazed ceramic, and plastic.

10. A method of forming electrical terminals for a firm resistor comprising the steps of (a) providing a dielectric substrate having a resistance film applied to the surface thereof, said film having a configuration corresponding to the combined resistive portion and said terminals of said resistor, (b) applying a resist to said resistive portion leaving an exposed portion of said film corresponding to said electrical terminals, (c) reducing an exterior layer of said exposed portion of film to form a metallic layer thereon, and thereafter (d) immersing the unit so formed in an electroless copper plating bath whereby copper is deposited onto said metallic layer.

11. The method of claim 10 wherein said dielectric substrate is selected from the group consisting of glass, ceramic, glazed ceramic, and plastic.

12. The method of claim 10 wherein said metallic oxide comprises tin oxide.

13. The method of claim 12 wherein the exterior portion of said tin oxide film is reduced by immersion into a mixture of zinc and hydrochloric acid.

14. The method of claim 13 wherein said zinc-hydrochloric acid mixture comprises by weight approximately one part powdered zinc and 100 parts of one percent by weight hydrochloric acid.

15. The method of forming an electrical circuit having at least electrically conductive and resistive portions in contact with each other upon a dielectric substrate comprising the steps of (a) providing a dielectric substrate, (b) forming an adherent film of metallic oxide on the surface of the substrate having a configuration corresponding to the combined resistive and conductive portions of said circuit, (c) coating a resist on said film corresponding to said resistive portion of said circuit, the remaining exposed portion of said film corresponding to said conductive portion, (d) reducing an exterior layer of said exposed portion of film to form a metallic layer thereon, and thereafter (e) immersing the substrate with the exposed metallic layer thereon in an electroless copper plating bath whereby copper is deposited onto the metallic layer surface.

16. The method of forming an electrical circuit having at least electrically conductive and resistive portions in contact with each other upon a dielectric substrate comprising the steps of (a) providing a dielectric substrate, (b) forming an adherent resistive film of tin oxide on the surface of said substrate having a configuration corresponding to the combined resistive and conductive portions of said circuit, (c) coating a resist on said film corresponding to said resistive portion of said circuit, the remaining exposed portion of said film corresponding to said conductive portion, (d) reducing an exterior layer on said exposed portion of film to form a metallic tin layer thereon by immersion of the coated substrate into a mixture of zinc and hydrochloric acid, and thereafter (e) immersing the substrate with the exposed metallic tin coating thereon in an electroless copper plating bath whereby copper is deposited onto the metallic tin surface.

17. The method of claim 16 wherein the zinc-hydrochloric acid mixture comprises by weight approximately one part powdered zinc and 100 parts one percent by weight hydrochloric acid.

18. The product produced by the method of claim 1.

References Cited by the Examiner

UNITED STATES PATENTS

| | | | |
|---|---|---|---|
| 3,207,127 | 9/1965 | Smith | 118—58 |
| 3,210,214 | 10/1965 | Smith | 117—212 |
| 3,249,467 | 5/1966 | Stookey | 117—212 |

ALFRED L. LEAVITT, *Primary Examiner.*

WILLIAM L. JARVIS, *Examiner.*